United States Patent
Li et al.

(10) Patent No.: US 9,691,790 B2
(45) Date of Patent: Jun. 27, 2017

(54) DISPLAY SUBSTRATE AND METHOD OF MANUFACTURING THE SAME

(71) Applicant: SAMSUNG DISPLAY CO., LTD., Yongin, Gyeonggi-Do (KR)

(72) Inventors: Xinxing Li, Suwon-si (KR); Man-Jin Kim, Seoul (KR); Jong-Kyun Park, Cheonan-si (KR); Keum-Hee Lee, Goyang-si (KR); Gi-Jung Lee, Asan-si (KR); Chan-Young Lim, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/671,940

(22) Filed: Mar. 27, 2015

(65) Prior Publication Data

US 2016/0126255 A1 May 5, 2016

(30) Foreign Application Priority Data

Oct. 31, 2014 (KR) ........................ 10-2014-0150695

(51) Int. Cl.
   *H01L 27/12* (2006.01)
   *G02F 1/1343* (2006.01)
   *G02F 1/1362* (2006.01)

(52) U.S. Cl.
   CPC .......... *H01L 27/124* (2013.01); *G02F 1/1343* (2013.01); *G02F 1/134309* (2013.01); *G02F 2001/13629* (2013.01)

(58) Field of Classification Search
   CPC ........... G02F 1/134363; G02F 1/13439; G02F 1/134327; G02F 1/1343; G02F 1/134309; G02F 1/136289; G02F 2001/13629; H01L 27/124
   See application file for complete search history.

(56) References Cited

U.S. PATENT DOCUMENTS

| 2014/0132875 A1* | 5/2014 | Yun ................... H01L 29/66742 349/46 |
| 2014/0184964 A1* | 7/2014 | Byeon ............... G02F 1/134363 349/33 |
| 2015/0155309 A1 | 6/2015 | Li et al. |

FOREIGN PATENT DOCUMENTS

| KR | 10-0254870 B1 | 5/2000 |
| KR | 10-2005-0058589 A | 6/2005 |
| KR | 10-2006-0104709 A | 10/2006 |

OTHER PUBLICATIONS

U.S. Appl. No. 14/249,199(unpublished application) (On Order).

* cited by examiner

*Primary Examiner* — Jose R Diaz
(74) *Attorney, Agent, or Firm* — Lewis Roca Rothgerber Christie LLP

(57) ABSTRACT

A display substrate includes a gate metal pattern including a gate line on a base substrate and extending in a first direction, and a gate electrode electrically connected with the gate line, a data metal pattern on the gate metal pattern and including a data line extending in a second direction crossing the first direction, a source electrode electrically connected with the gate line and a drain electrode spaced apart from the source electrode, a first electrode pattern on the data metal pattern, a low-resistance electrode pattern on the first electrode pattern and entirely overlapping with the gate metal pattern and the data metal pattern and a second electrode pattern overlapping with the first electrode pattern.

10 Claims, 10 Drawing Sheets

DISPLAY SUBSTRATE AND METHOD OF MANUFACTURING THE SAME

CROSS-REFERENCE TO RELATED APPLICATION

This application claims priority to and the benefit of Korean Patent Application No. 10-2014-0150695, filed on Oct. 31, 2014 in the Korean Intellectual Property Office KIPO, the contents of which are herein incorporated by reference in their entireties.

BACKGROUND

1. Field

One or more embodiments of the present invention relate to a display substrate and a method of manufacturing the display substrate.

2. Description of the Related Art

Generally, a liquid crystal display ("LCD") apparatus includes a display substrate, an upper substrate, and a liquid crystal layer interposed between the display substrate and the upper substrate. A plurality of signal lines and a plurality of thin film transistors are formed on the display substrate.

Generally, a liquid crystal display panel uses a twisted nematic ("TN") mode. Often, the liquid crystal display panel uses a plane to line switching ("PLS") mode in order to ensure a wide view angle.

A liquid crystal display panel with PLS mode capability includes a pixel electrode and a common electrode overlapped with the pixel electrode. An electric field applied between the pixel electrode and the common electrode spins liquid crystal molecules, to represent a gray levels.

The common electrode may be made by a transparent layer including indium zinc oxide (IZO). However, the IZO may have a high resistance. Thus, defects caused by the high resistance, such as stains, may occur in a large liquid crystal display panel. To prevent these defects, a contact hole and a common line connecting electrode are formed. Accordingly, a light-blocking member that blocks the contact hole and the common line may be used, thereby resulting in reduction of transmissivity of the panel.

SUMMARY

One or more embodiments of the present invention provide a display substrate capable of decreasing resistance and increasing transmissivity.

One or more embodiments of the present invention further provide a method of manufacturing the display substrate.

In one or more embodiments of a display substrate according to the present invention, the display substrate includes a gate metal pattern including a gate line on a base substrate and extending in a first direction, and a gate electrode electrically connected with the gate line, a data metal pattern on the gate metal pattern and including a data line extending in a second direction crossing the first direction, a source electrode electrically connected with the gate line and a drain electrode spaced apart from the source electrode, a first electrode pattern on the data metal pattern, a low-resistance electrode pattern on the first electrode pattern and entirely overlapping with the gate metal pattern and the data metal pattern and a second electrode pattern overlapping with the first electrode pattern.

In one or more embodiments, the low-resistance electrode pattern may include the same material as the gate metal pattern or the data metal pattern.

In one or more embodiments, the low-resistance electrode pattern may be electrically connected to the first electrode pattern.

In one or more embodiments, the display substrate may further include an organic layer disposed between the data metal pattern and the first electrode pattern.

In one or more embodiments, the display substrate may further include a contact hole formed through the first electrode pattern, the low-resistance electrode pattern and the organic layer to exposure a portion of the drain electrode.

In one or more embodiments, the second electrode pattern may be electrically connected to the drain electrode through the contact hole.

In one or more embodiments, the second electrode pattern may include a transparent conductive material.

In one or more embodiments, a common voltage may be applied to the first electrode pattern.

In one or more embodiments, the first electrode pattern may include a transparent conductive material.

A method of manufacturing a display substrate according to one or more embodiments of the present invention includes forming a gate metal pattern including a gate line extending in a first direction and a gate electrode electrically connected to the gate line on a base substrate, forming a data metal pattern including a data line extending in a second direction crossing the first direction, a source electrode electrically connected with the gate line and a drain electrode spaced apart from the source electrode on the base substrate on which the gate metal pattern is formed, forming an organic layer on the base substrate on which the data metal pattern is formed, forming a first contact hole partially exposing the drain electrode on the organic layer, forming a first electrode pattern on the base substrate on which the first contact hole is formed, forming a low-resistance electrode pattern on the base substrate on which the first electrode pattern is formed, forming a second contact hole partially exposing the organic layer and the drain electrode by removing a portion of the first electrode pattern and a portion of the low-resistance electrode pattern and forming a second electrode on the base substrate on which the second contact hole is formed.

In one or more embodiments, forming the low-resistance electrode pattern may include forming a photoresist layer on the first electrode pattern, exposing the photoresist layer using back exposure through the base substrate to form a photoresist pattern, forming a low-resistance electrode layer on the photoresist pattern and removing a portion of the photoresist pattern.

In one or more embodiments, removing a portion of the photoresist pattern may include removing a portion of the low-resistance electrode layer disposed on the photoresist pattern.

In one or more embodiments, the photoresist layer may include a negative type photoresist composition.

In one or more embodiments, forming the second contact hole may include removing a portion of the first electrode pattern and a portion of the low-resistance electrode pattern by wet-etching, forming an insulation layer on the base substrate on which the first electrode pattern and the low-resistance electrode pattern are partially removed, and removing a portion of the insulation layer by a dry-etching.

In one or more embodiments, the low-resistance electrode pattern may include the same material as the gate metal pattern or the data metal pattern.

In one or more embodiments, the low-resistance electrode pattern may be electrically connected to the first electrode pattern.

In one or more embodiments, a common voltage may be applied to the first electrode pattern.

In one or more embodiments, the first electrode pattern may include a transparent conductive material.

In one or more embodiments, the second electrode pattern may be electrically connected to the drain electrode.

In one or more embodiments, the second electrode pattern may include a transparent conductive material.

In one or more embodiments, the low-resistance electrode pattern is directly formed on the common electrode. Therefore, the low-resistance electrode pattern is electrically connected to the common electrode, so that a resistance of the common electrode CE may be decreased.

In addition, since the resistance of the common electrode is decreased, voltage may be applied to the common electrode uniformly or substantially uniformly. Accordingly, defects caused by high resistance, such as stains, may be reduced or minimized.

In addition, since the resistance of the common electrode CE is reduced, a common line connected to the common electrode CE may be omitted. Thus, a contact hole connecting the common electrode CE and the common line may be omitted. Accordingly, since the common line and the contact hole are omitted, transmissivity of the panel may be increased.

BRIEF DESCRIPTION OF THE DRAWINGS

The above and other features and aspects of embodiments of the present invention will become more apparent by describing exemplary embodiments thereof with reference to the accompanying drawings, in which.

DETAILED DESCRIPTION

Hereinafter, one or more embodiments of the present invention are explained with reference to the accompanying drawings.

The terminology used herein is for the purpose of describing particular embodiments only and is not intended to be limiting of the inventive concept. As used herein, the singular forms "a" and "an" are intended to include the plural forms as well, unless the context clearly indicates otherwise. It will be further understood that the terms "comprises," "comprising," "includes," and/or "including" when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Further, the use of "may" when describing embodiments of the inventive concept refers to "one or more embodiments of the inventive concept." Also, the term "exemplary" is intended to refer to an example or illustration.

It will be understood that when an element or layer is referred to as being "on", "connected to", "coupled to", or "adjacent to" another element or layer, it can be directly on, connected to, coupled to, or adjacent to the other element or layer, or one or more intervening elements or layers may be present. When an element or layer is referred to as being "directly on," "directly connected to", "directly coupled to", or "immediately adjacent to" another element or layer, there are no intervening elements or layers present.

In addition, it will also be understood that when a layer is referred to as being "between" two layers, it can be the only layer between the two layers, or one or more intervening layers may also be present.

Figure 1:
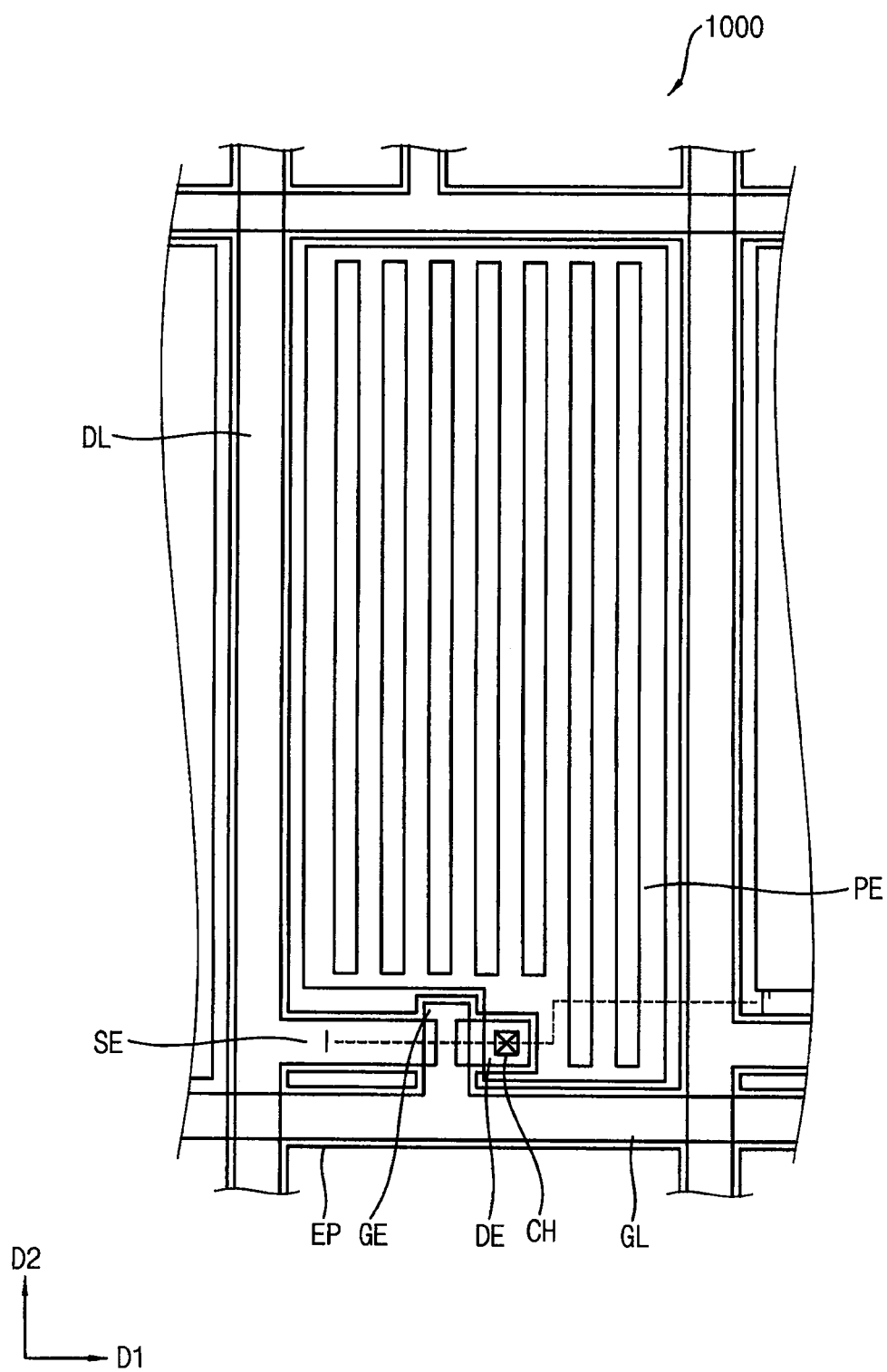
FIG. 1 is a plan view illustrating a display substrate according to one or more embodiments of the present invention.
Figure 2:
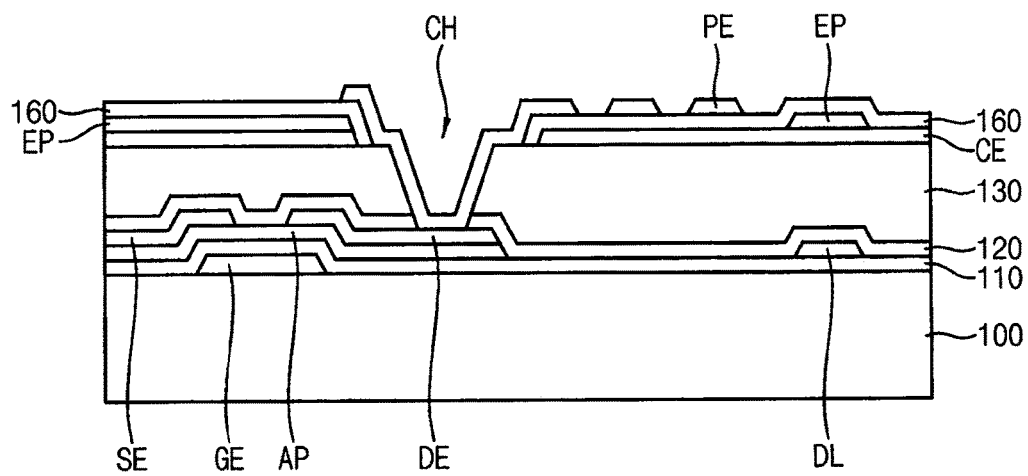
FIG. 2 is a cross-sectional view taken along the line I-I' of FIG. 1.

FIG. 1 is a plan view illustrating a display substrate according to one or more embodiments of the present invention. FIG. 2 is a cross-sectional view taken along the line I-I' of FIG. 1.

Referring to FIGS. 1 and 2, a display substrate 1000 according to one or more embodiments of the present invention includes a base substrate 100, a gate metal pattern including a gate line GL and a gate electrode GE, a data metal pattern including a data line DL, a source electrode SE, and a drain electrode DE, a gate insulation layer 110, an active pattern AP, a first passivation layer 120, an organic layer 130, a common electrode CE, a low-resistance electrode pattern EP, a second passivation layer 160 and a pixel electrode PE.

The gate line GL extends in a first direction D1. The gate line GL may have a single layer structure including copper (Cu), silver (Ag), chrome (Cr), molybdenum (Mo), aluminum (Al), titanium (Ti), manganese (Mn) and/or a mixture thereof. In addition, the gate line GL may have a multi-layer structure having a plurality of layers including distinct materials (e.g., each layer including a material that differs from the material of at least another layer). For example, the gate line GL may include a copper layer and a titanium layer disposed on and/or under the copper layer. The gate line GL is electrically connected to a gate electrode GE of a switching element. In addition, portions of the gate line GL may form the gate electrode GE.

The gate insulation layer 110 is formed on the gate line GL and the gate electrode GE. The gate insulation layer 110 may include an inorganic material such as silicon oxide (SiOx) and/or silicon nitride (SiNx). For example, the gate insulation layer 110 may include silicon oxide (SiOx), and may have a thickness of about 500 Å (angstrom). In addition, the gate insulation layer 110 may include a plurality of layers including distinct materials (e.g., each layer including a material that differs from the material of at least another layer).

The active pattern AP is formed on the gate insulation layer 110. The active pattern AP may include a semiconductor pattern and an ohmic contact pattern. The ohmic contact pattern is formed on the semiconductor pattern. The semiconductor pattern may include a silicon semiconductor material. For example, the semiconductor pattern may include amorphous silicon (a-Si:H). The ohmic contact pattern may be interposed between the semiconductor pattern and the source electrode SE, and may be interposed between the semiconductor pattern and the drain electrode DE. The ohmic contact pattern may include n+ amorphous silicon (n+a-Si:H).

The data metal pattern may be disposed on the active pattern AP. The data metal pattern may include the data line DL, the source electrode SE and the drain electrode DE. The data metal pattern may have a single layer structure including copper (Cu), silver (Ag), chrome (Cr), molybdenum (Mo), aluminum (Al), titanium (Ti), manganese (Mn) and/or a mixture thereof. In addition, the data metal pattern may have a multi-layer structure having a plurality of layers including distinct materials (e.g., each layer including a material that differs from the material of at least another layer).

The first passivation layer 120 may be formed on the data metal pattern. The first passivation layer 120 may include an inorganic material such as silicon oxide (SiOx) and/or silicon nitride (SiNx). For example, the first passivation layer 120 may include silicon oxide (SiOx), and may have a thickness of about 500 Å. In addition, the first passivation layer 120 may include a plurality of layers including distinct materials (e.g., each layer including a material that differs from the material of at least another layer).

The organic layer 130 is disposed on the first passivation layer 120. The organic layer 130 planarizes an upper surface of the display substrate 1000 to minimize or prevent problems such as disconnection of a signal line that may occur when the surface is not planar (e.g., when the surface includes a step). The organic layer 130 may be an insulation layer including an organic material. For example, the organic layer 130 may be a color filter layer. When the organic layer 130 is a color filter layer, the color filter layer may be a color filter layer having a red color, a green color, a blue color, or a white color.

The common electrode CE may be disposed on the organic layer 130. The common electrode CE may include a transparent conductive material, such as indium tin oxide (ITO) and indium zinc oxide (IZO). In addition, the common electrode CE may include titanium (Ti) and/or molybdenum titanium (MoTi). A common voltage may be applied to the common electrode CE.

The low-resistance electrode pattern EP may be disposed on the common electrode CE. The low-resistance electrode pattern EP may have a single layer structure including copper (Cu), silver (Ag), chrome (Cr), molybdenum (Mo), aluminum (Al), titanium (Ti), manganese (Mn) and/or a mixture thereof. In addition, the low-resistance electrode pattern EP may have a multi-layer structure having a plurality of layers including distinct materials (e.g., each layer including a material that differs from the material of at least another layer). The low-resistance electrode pattern EP may include the same material as the gate metal pattern or the data metal pattern.

In some embodiments, the low-resistance electrode pattern EP entirely overlaps with the gate metal pattern and the data metal pattern from a plan view perspective. In other words, all portions of the low-resistance electrode pattern EP may be projected onto the gate metal pattern and/or the data metal pattern. In some embodiments, the low-resistance electrode pattern EP is directly formed on the common electrode CE. Thus, the low-resistance electrode pattern EP is electrically connected to the common electrode CE.

Since the low-resistance electrode pattern EP is electrically connected to the common electrode CE, resistance of the common electrode CE may be decreased. Thus, voltage may be applied to the common electrode CE uniformly or substantially uniformly. Accordingly, defects caused by high resistance, such as stains, may be minimized or reduced.

In addition, since the resistance of the common electrode CE is reduced, a common line connected to the common electrode CE may be omitted. Thus, a contact hole between the common electrode CE and the common line may be omitted. Accordingly, since the common line and the contact hole are omitted, transmissivity of the panel may be increased.

The second passivation layer 160 may be formed on the low-resistance electrode pattern EP. The second passivation layer 160 may include an inorganic material such as silicon oxide (SiOx) and/or silicon nitride (SiNx). For example, the second passivation layer 160 may include silicon oxide (SiOx), and may have a thickness of about 500 Å. In addition, the second passivation layer 160 may include a plurality of layers made of different materials (e.g., each layer including a material that differs from the material of at least another layer).

A contact hole CH may be formed through the first passivation layer 120, the organic layer 130, the common electrode CE and the low-resistance electrode pattern EP. The contact hole CH partially exposes the drain electrode DE.

A pixel electrode PE is formed on the second passivation layer 160. The pixel electrode PE may include a transparent conductive material, such as indium tin oxide (ITO) and indium zinc oxide (IZO). In addition, the pixel electrode PE may include titanium (Ti) and/or molybdenum titanium (MoTi). The pixel electrode PE may have a slit shape. The pixel electrode PE overlaps with the common electrode CE. Accordingly, an electric field applied between the pixel electrode PE and the common electrode CE spins the liquid crystal molecules to display a gray scale (i.e., gray levels).

FIGS. 3 to 12 and 14 to 16 are cross-sectional views illustrating a method of manufacturing the display substrate of FIGS. 1 and 2. FIG. 13 is a plan view illustrating an intermediate step during a method of manufacturing the display substrate of FIGS. 1 and 2

Figure 3:
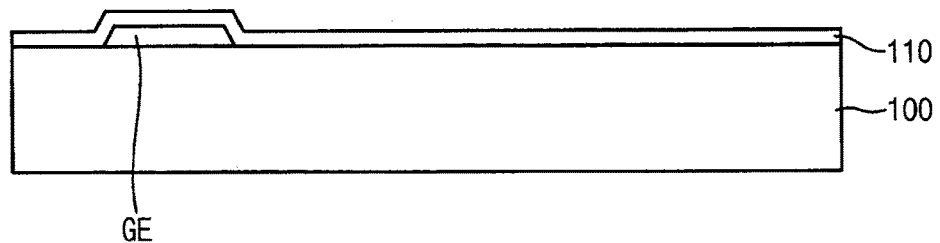
FIGS. 3 to 12 and 14 to 16 are cross-sectional views illustrating a method of manufacturing the display substrate of FIGS. 1 and 2.

Referring to FIG. 3, a gate electrode GE is formed on a base substrate 100. For example, a gate metal layer is formed on the base substrate 100, and patterned to form a gate line GL and the gate electrode GE. The gate metal pattern may include the gate line GL and the gate electrode GE.

Examples of the base substrate 100 may include a glass substrate, a quartz substrate, a silicon substrate, a plastic substrate and the like.

Thereafter, a gate insulation layer 110 is formed to cover the gate line GL and the gate electrode GE. The gate insulation layer 110 may include an inorganic insulation material. For example, the gate insulation layer 110 may include silicon oxide (SiOx) or silicon nitride (SiNx). For example, the gate insulation layer 110 may include silicon oxide (SiOx) and may have a thickness of 500 Å. In addition, the gate insulation layer 110 may have a multi-layer structure having a plurality of layers including distinct materials (e.g., each layer including a material that differs from the material of at least another layer).

Figure 4:
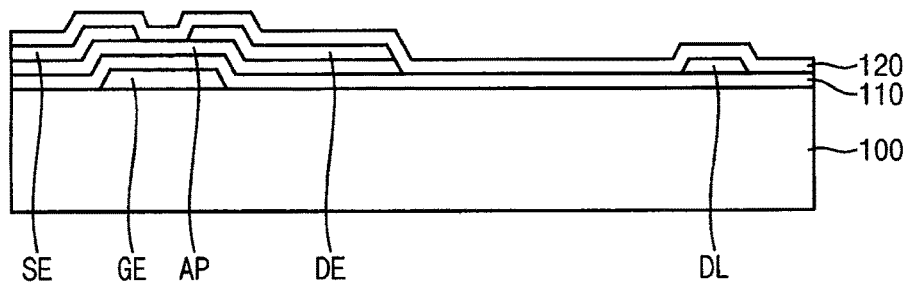

Referring to FIG. 4, an active pattern AP and a data metal pattern are formed on the gate insulation layer 110. The data metal pattern may include a data line DL, a source electrode SE and a drain electrode DE.

The active pattern AP is formed on the gate insulation layer 110. The active pattern AP may include a semiconductor pattern and an ohmic contact pattern. The ohmic contact pattern is formed on the semiconductor pattern. The semiconductor pattern may include a silicon semiconductor material. For example, the semiconductor pattern may include amorphous silicon (a-Si:H). The ohmic contact pattern may be interposed between the semiconductor pattern and a source electrode SE, and may be interposed between the semiconductor pattern and a drain electrode DE. The ohmic contact pattern may include n+ amorphous silicon (n+a-Si:H).

The data metal pattern may be disposed on the active pattern AP. The data metal pattern may include the data line DL, the source electrode SE and the drain electrode DE. The data metal pattern may have a single layer structure including copper (Cu), silver (Ag), chrome (Cr), molybdenum (Mo), aluminum (Al), titanium (Ti), manganese (Mn) and/or a mixture thereof. In addition, the data metal pattern may have a multi-layer structure having a plurality of layers including distinct materials (e.g., each layer including a material that differs from the material of at least another layer).

The first passivation layer 120 may be formed on the data metal pattern. The first passivation layer 120 may include an inorganic material such as silicon oxide (SiOx) and/or silicon nitride (SiNx). For example, the first passivation layer 120 includes silicon oxide (SiOx), and may have a thickness of about 500 Å. In addition, the first passivation layer 120 may include a plurality of layers including distinct materials (e.g., each layer including a material that differs from the material of at least another layer).

Figure 5:
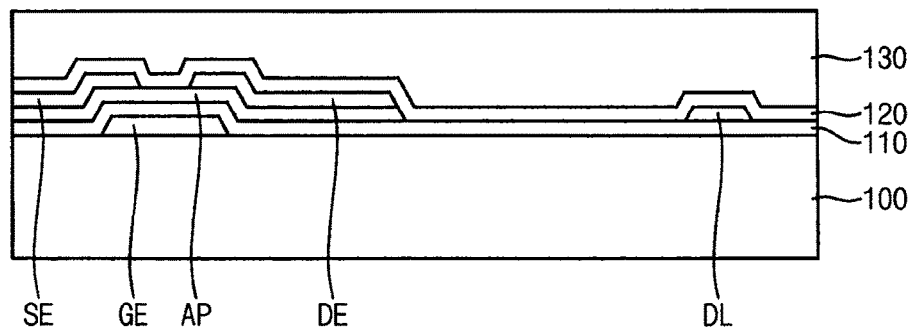

Referring to FIG. 5, an organic layer 130 is formed on the first passivation layer 120.

The organic layer 130 is disposed on the first passivation layer 120. The organic layer 130 planarizes an upper surface of the display substrate 1000 to minimize or prevent problems such as disconnection of a signal line that may occur when the surface is not planar, e.g., when the surface includes a step. The organic layer 130 may be an insulation layer including an organic material. For example, the organic layer 130 may be a color filter layer. When the organic layer 130 is a color filter layer, the color filter layer may be a color filter layer having a red color, a green color, a blue color or a white color.

Figure 6:
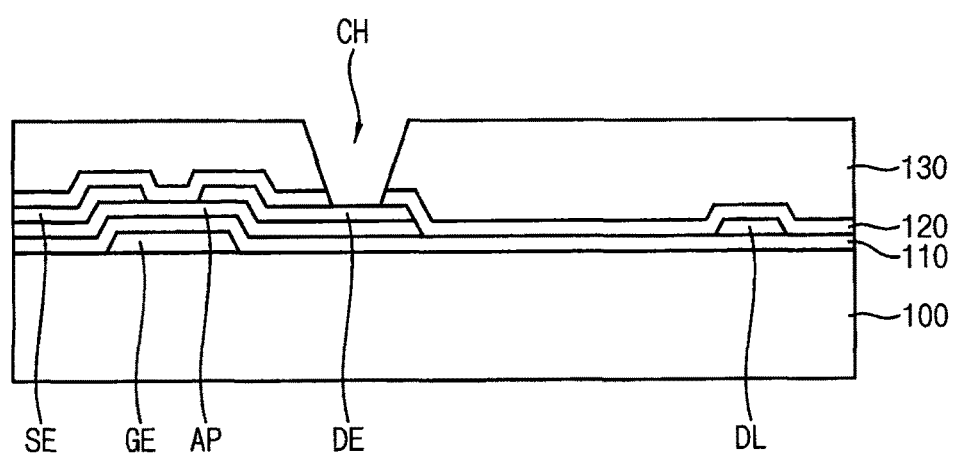

Referring to FIG. 6, a contact hole CH is formed through the first passivation layer 120 and the organic layer 130.

The first passivation layer 120 and the organic layer 130 may be partially removed by dry-etching. The contact hole CH partially exposes the drain electrode DE.

Figure 7:
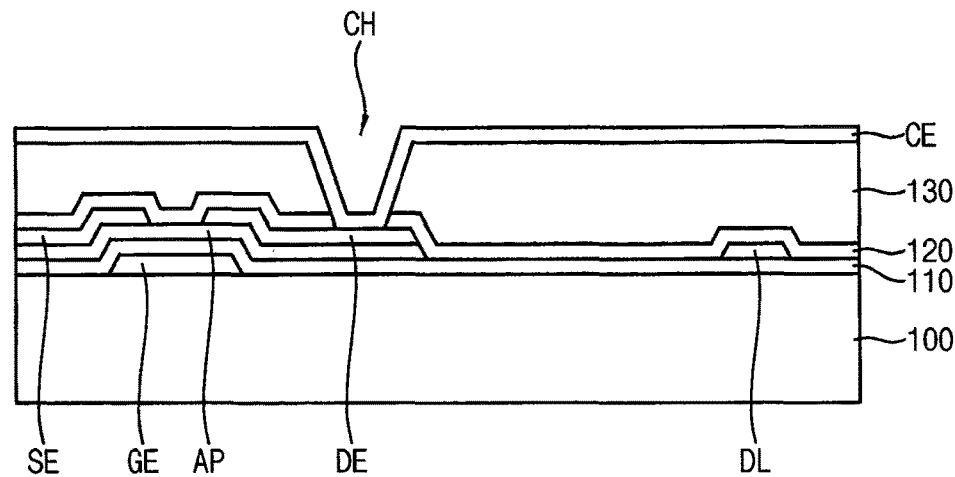

Referring to FIG. 7, a common electrode CE is formed on the base substrate 100 on which the contact hole CH is formed.

The common electrode CE may include a transparent conductive material, such as indium tin oxide (ITO) and indium zinc oxide (IZO). In addition, the common electrode CE may include titanium (Ti) and/or molybdenum titanium (MoTi). A common voltage may be applied to the common electrode CE.

Figure 8:
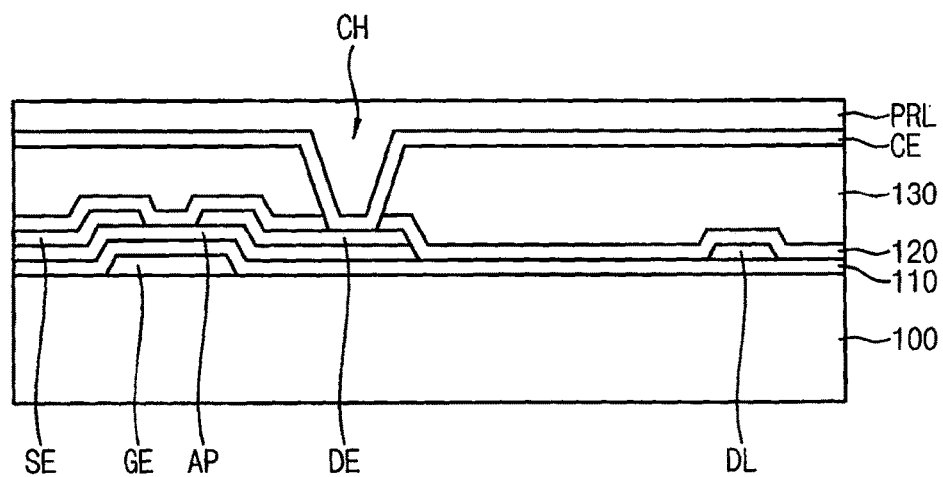

Referring to FIG. 8, a photoresist layer PRL is formed on the base substrate 100 on which the common electrode CE is formed.

The photoresist layer PRL includes a photoresist composition. The photoresist composition may be a negative type photoresist composition. For example, the photoresist composition may include an ethylenically unsaturated compound (e.g., a compound including an ethylenyl group or portion), a photopolymerization initiator, a thermosetting compound and an organic solvent.

When the photoresist layer PRL includes a negative type photoresist composition, an unexposed portion of the photoresist layer PRL is removed by a developer.

Figure 9:
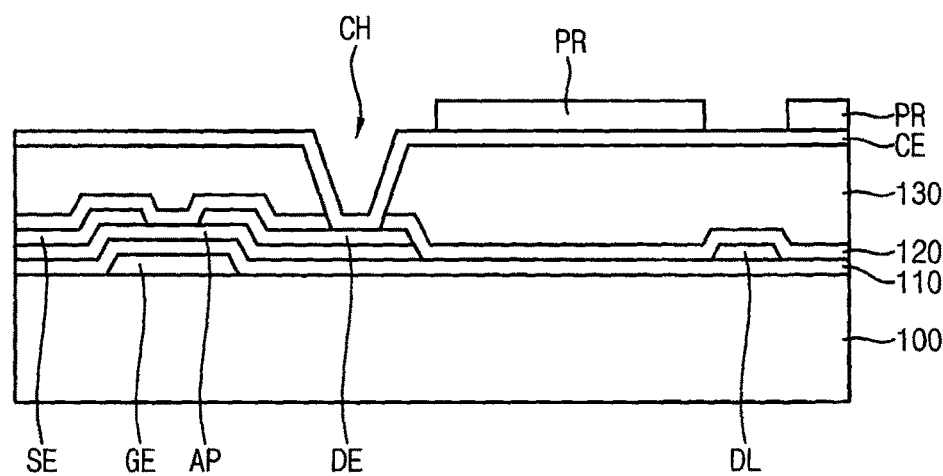

Referring to FIG. 9, the photoresist layer PRL is back exposed to form a photoresist pattern PR.

As stated above, the photoresist layer PRL includes a photoresist composition. The photoresist composition may be a negative type photoresist composition. When the photoresist layer PRL includes a negative type photoresist composition, an unexposed portion of the photoresist layer PRL is removed by a developer. Therefore, an exposed portion of the photoresist layer PRL remains on the common electrode CE.

When the photoresist layer PRL includes a positive type photoresist composition, an exposed portion of the photoresist layer PRL is removed by a developer. The photoresist layer PRL is exposed by using the gate metal pattern and the data metal pattern as a mask to form the photoresist pattern PR.

The photoresist layer PRL may be exposed by back exposure. Thus, light is irradiated from a lower surface of the base substrate 100 to an upper surface of the base substrate 100. Examples of the base substrate 100 may include a glass substrate, a quartz substrate, a silicon substrate, a plastic substrate and the like. Thus, light is transmitted through the base substrate 100.

In addition, the common electrode CE may include a transparent conductive material, such as indium tin oxide (ITO) and indium zinc oxide (IZO). Thus, light is also transmitted through the common electrode CE.

However, the gate metal pattern and the data metal pattern include metal, so light is not transmitted through the gate metal pattern or the data metal pattern. For example, the gate metal pattern and the data metal pattern may have a single layer structure including copper (Cu), silver (Ag), chrome (Cr), molybdenum (Mo), aluminum (Al), titanium (Ti), manganese (Mn) and/or a mixture thereof. In addition, the gate metal pattern and the data metal pattern may have a multi-layer structure having a plurality of layers including distinct materials (e.g., each layer including a material that differs from the material of at least another layer).

Therefore, a portion of the photoresist layer PRL disposed on the gate metal pattern and the data metal pattern is not exposed. In one or more embodiments wherein the photoresist layer PRL includes a negative type photoresist composition, an unexposed portion of the photoresist layer PRL is removed by a developer. That is, any portion of the photoresist layer PRL that is disposed on an area that does not overlap with the gate metal pattern and the data metal pattern remains on the common electrode CE. Therefore, the photoresist pattern PR is formed on the common electrode CE.

Figure 10:
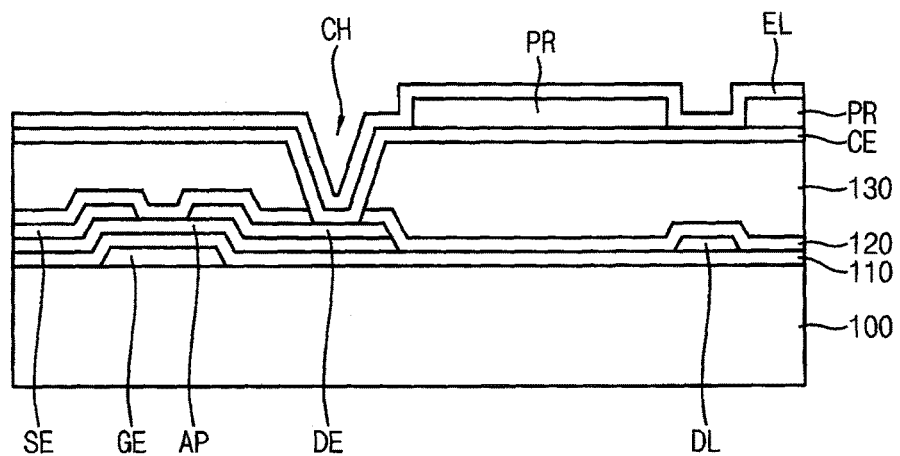

Referring to FIG. 10, a low-resistance electrode layer EL is formed on the base substrate 100 on which the photoresist pattern PR is formed.

The low-resistance electrode layer EL may have a single layer structure including copper (Cu), silver (Ag), chrome (Cr), molybdenum (Mo), aluminum (Al), titanium (Ti), manganese (Mn) and/or a mixture thereof. In addition, the low-resistance electrode layer EL may have a multi-layer structure having a plurality of layers including distinct materials (e.g., each layer including a material that differs from the material of at least another layer). The low-resistance electrode layer EL may include the same material as the gate metal pattern or the data metal pattern.

However, embodiments of the present invention are not limited thereto. For example, the low-resistance electrode layer EL may include any suitable metal having low resistance.

Figure 11:
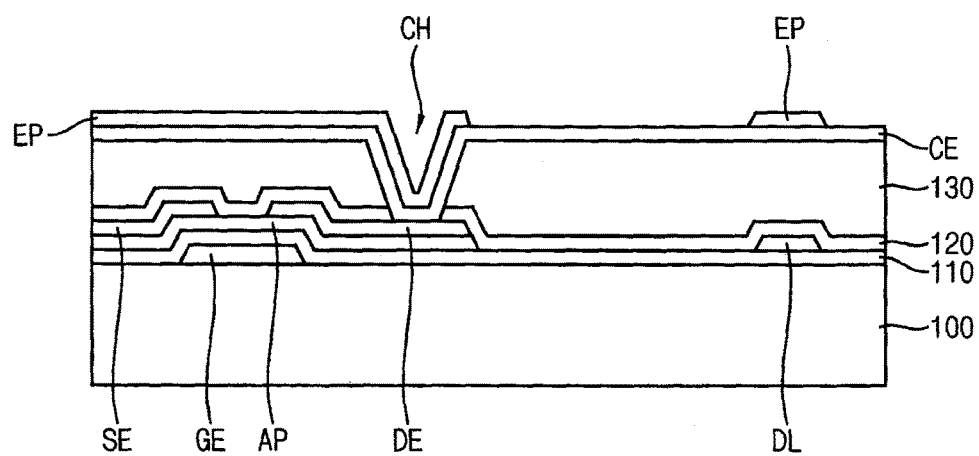

Referring to FIG. 11, a low-resistance electrode pattern EP is formed on the base substrate 100.

The low-resistance electrode layer EL is partially removed to form the low-resistance electrode pattern EP. The photoresist pattern PR is removed using a developer. The low-resistance electrode layer EL covering the photoresist pattern PR may be removed by lift-off process.

When the photoresist pattern PR is removed, a portion of the low-resistance electrode layer EL disposed on the photoresist pattern PR is also removed (i.e., removed simultaneously or concurrently). Therefore, the low-resistance electrode pattern EP is formed on the common electrode CE.

As discussed above, the photoresist pattern PR remains on the common electrode CE after removal by the developer in areas that do not overlap with the gate metal pattern and the data metal pattern. Thus, any portion of the low-resistance electrode layer EL disposed on an area that does not overlap with the gate metal pattern and the data metal pattern may be removed with the photoresist pattern PR.

Therefore, the low-resistance electrode pattern EP is formed on an area overlapping with the gate metal pattern and the data metal pattern.

Referring to FIG. 13, the low-resistance electrode pattern EP entirely overlaps with the gate metal pattern and the data metal pattern from a plan view perspective. The low-resistance electrode pattern EP is directly formed on the common electrode CE. Therefore, the low-resistance electrode pattern EP is electrically connected to the common electrode CE.

Since the low-resistance electrode pattern EP is electrically connected to the common electrode CE, resistance of the common electrode CE may be decreased. Thus, voltage may be applied to the common electrode CE uniformly or substantially uniformly. Accordingly, defects caused by high resistance, such as stains, may be minimized or reduced.

Figure 12:
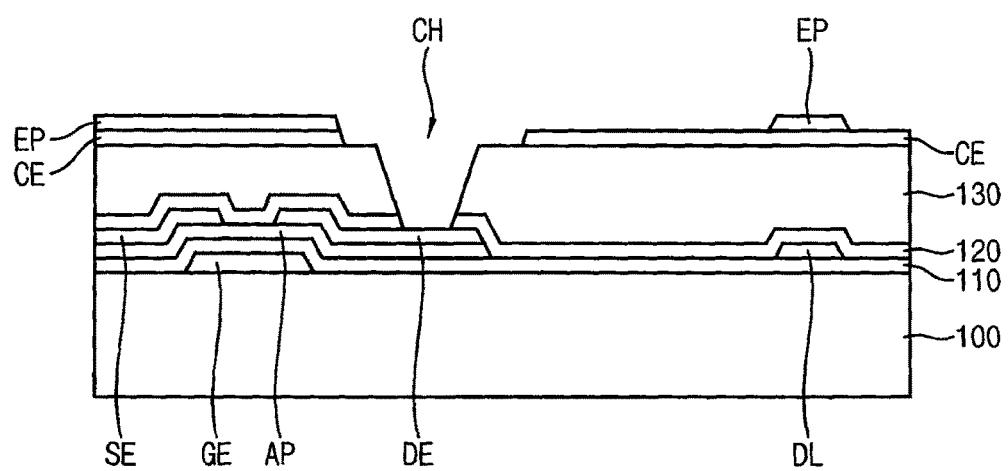
Figure 13:
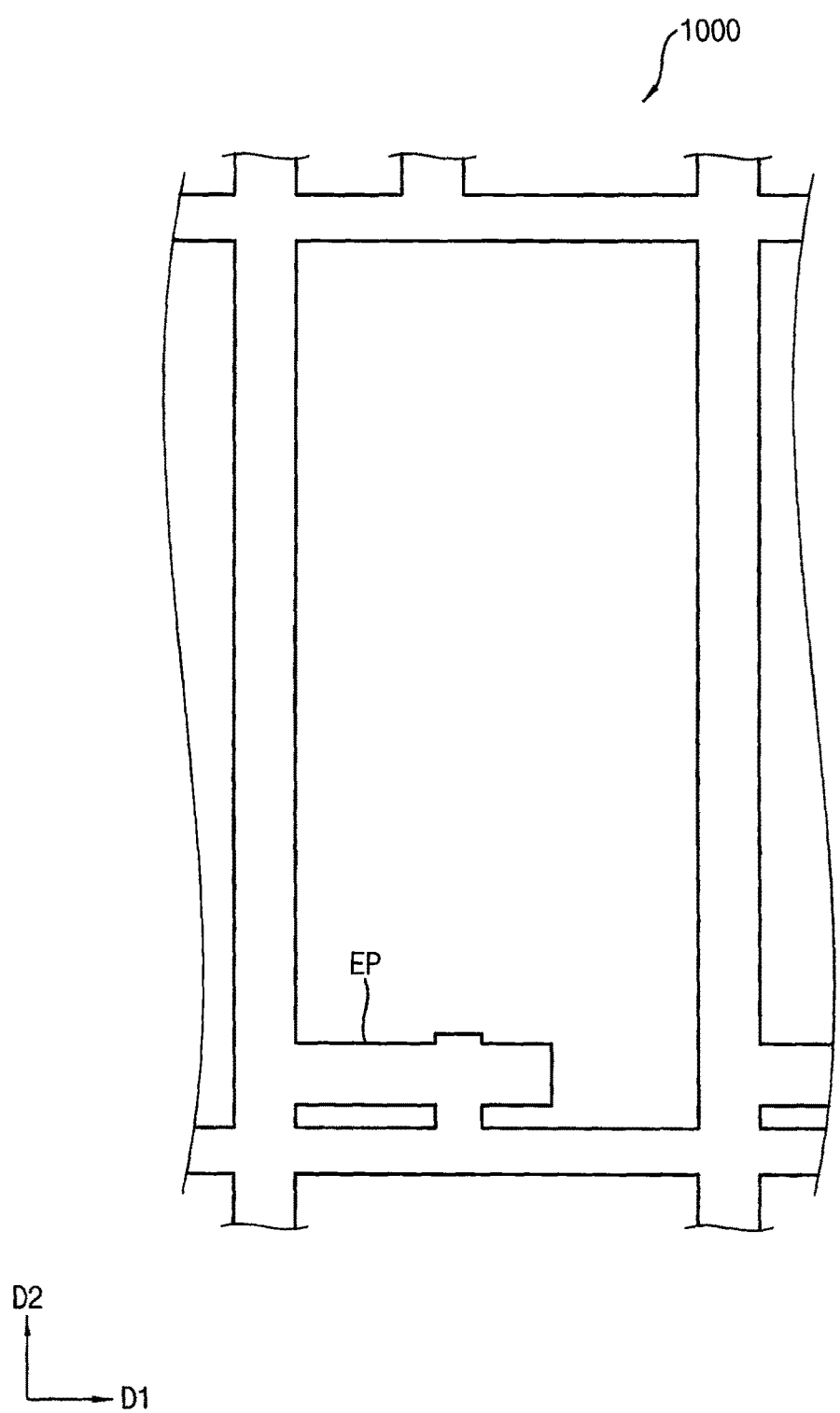
FIG. 13 is a plan view illustrating an intermediate step during a method of manufacturing the display substrate of FIGS. 1 and 2.

Referring to FIG. 12, the common electrode CE and the low-resistance electrode pattern EP are partially removed to form the contact hole CH.

The common electrode CE and the low-resistance electrode pattern EP may be partially removed by wet-etching to form a contact hole CH. The common electrode CE and the low-resistance electrode pattern EP are partially removed to expose a portion of the drain electrode DE. In addition, a portion of the first passivation layer 120 and a portion of the organic layer 130 may be exposed.

Figure 14:
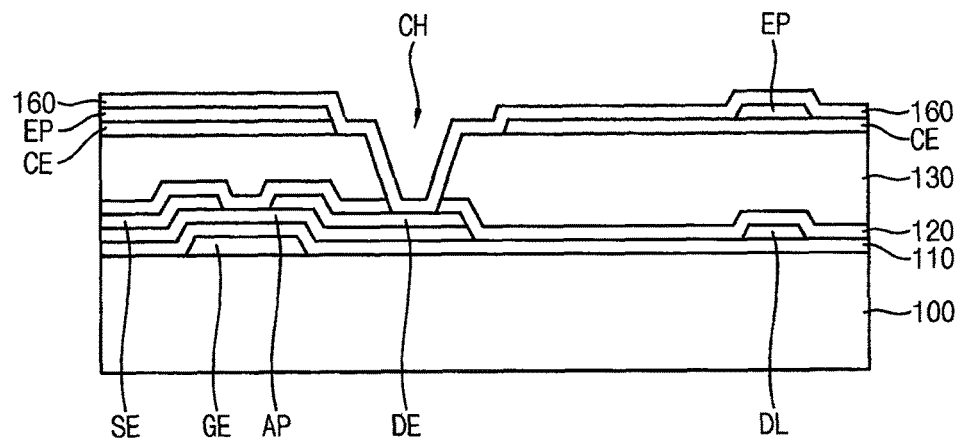

Referring to FIG. 14, a second passivation layer 160 is formed on the base substrate 100 on which the contact hole CH is formed.

The second passivation layer 160 may include an inorganic material such as silicon oxide (SiOx) and/or silicon nitride (SiNx). For example, the second passivation layer 160 may include silicon oxide (SiOx), and may have a thickness of about 500 Å. In addition, the second passivation layer 160 may include a plurality of layers including distinct materials (e.g., each layer including a material that differs from the material of at least another layer).

The second passivation layer 160 covers the exposed drain electrode DE, the first passivation layer 120, the organic layer 130, the common electrode CE and the low-resistance electrode pattern EP.

Figure 15:
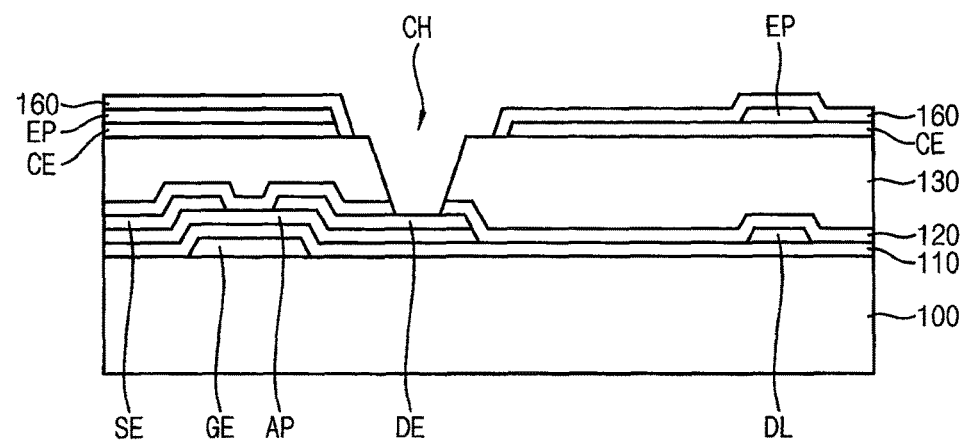

Referring to FIG. 15, the second passivation layer 160 is partially removed to form the contact hole CH.

The second passivation layer 160 is etched to form a contact hole CH. The second passivation layer 160 may be partially removed by dry-etching to form the contact hole CH.

The second passivation layer 160 is partially removed to expose a portion of the first passivation layer 120 and a portion of the organic layer 130. The common electrode CE and the low-resistance electrode pattern EP are covered by the second passivation layer 160.

Figure 16:
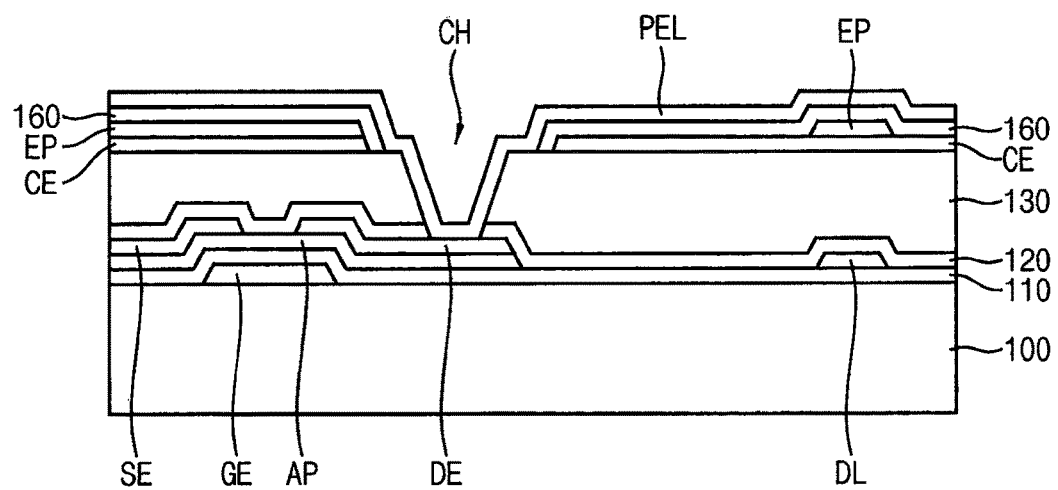

Referring to FIG. 16, a transparent electrode layer PEL is formed on the base substrate 100 on which the contact hole CH is formed.

The transparent electrode layer PEL may include a transparent conductive material, such as indium tin oxide (ITO) and indium zinc oxide (IZO). In addition, transparent electrode layer PEL may include titanium (Ti) and/or molybdenum titanium (MoTi).

Referring to FIG. 2, the transparent electrode layer PEL is patterned to form a pixel electrode PE.

The pixel electrode PE is formed on the second passivation layer 160. The pixel electrode PE may include a transparent conductive material, such as indium tin oxide (ITO) and indium zinc oxide (IZO). In addition, the pixel electrode PE may include titanium (Ti) and/or molybdenum titanium (MoTi). The pixel electrode PE may have a slit shape. The pixel electrode PE overlaps with the common electrode CE. Accordingly, an electric field applied between the pixel electrode PE and the common electrode CE spins liquid crystal molecules to display a gray scale (i.e., gray levels or gray scale levels).

In one or more embodiments, the common electrode may be formed under the pixel electrode. However, the present invention is not limited thereto. For example, the pixel electrode may be formed under the common electrode.

According to one or more embodiments of the present invention, the low-resistance electrode pattern is directly formed on the common electrode. Thus, the low-resistance electrode pattern is electrically connected to the common electrode, allowing resistance of the common electrode CE to be decreased.

In addition, since the resistance of the common electrode is decreased, voltage may be applied to the common electrode uniformly or substantially uniformly. Accordingly, defects caused by high resistance, such as stains, may be minimized or reduced.

Further, since the resistance of the common electrode CE is decreased, a common line connected to the common electrode CE may be omitted. Thus, a contact hole connecting the common electrode CE and the common line may be omitted. Accordingly, since the common line and the contact hole are omitted, transmissivity of the panel may be increased.

The foregoing is illustrative of various embodiments the present invention and is not to be construed as limiting thereof. Although a few exemplary embodiments of the present invention have been described, those skilled in the art will readily appreciate that many modifications are possible in the exemplary embodiments without materially departing from the novel teachings and advantages of the present invention.

Accordingly, all such modifications are intended to be included within the scope of the present invention as defined in the claims. In the claims, means-plus-function clauses are intended to cover the structures described herein as performing the recited function and not only structural equivalents but also equivalent structures. Therefore, it is to be understood that the foregoing is illustrative of the present invention and is not to be construed as limited to the specific exemplary embodiments disclosed, and that modifications to the disclosed exemplary embodiments, as well as other exemplary embodiments, are intended to be included within the scope of the appended claims. One or more embodiments of the present invention are defined by the following claims, with equivalents of the claims to be included therein.

What is claimed is:

1. A display substrate comprising:
   a gate metal pattern comprising a gate line on a base substrate and extending in a first direction, and a gate electrode electrically connected with the gate line;

a data metal pattern on the gate metal pattern and comprising a data line extending in a second direction crossing the first direction, a source electrode electrically connected with the gate line and a drain electrode spaced apart from the source electrode;

a first electrode pattern on the data metal pattern;

a low-resistance electrode pattern on the first electrode pattern; and a second electrode pattern overlapping with the first electrode pattern, wherein the gate electrode in its entirety is overlapped by the low-resistance electrode pattern.

2. The display substrate of claim 1, wherein the low-resistance electrode pattern comprises the same material as the gate metal pattern or the data metal pattern.

3. The display substrate of claim 2, wherein the low-resistance electrode pattern is electrically connected to the first electrode pattern.

4. The display substrate of claim 1, further comprising:

an organic layer between the data metal pattern and the first electrode pattern.

5. The display substrate of claim 4, further comprising:

a contact hole through the first electrode pattern, the low-resistance electrode pattern, and the organic layer and exposing a portion of the drain electrode.

6. The display substrate of claim 5, wherein the second electrode pattern is electrically connected to the drain electrode through the contact hole.

7. The display substrate of claim 5, wherein the second electrode pattern comprises a transparent conductive material.

8. The display substrate of claim 1, wherein a common voltage is applied to the first electrode pattern.

9. The display substrate of claim 1, wherein the first electrode pattern comprises a transparent conductive material.

10. The display substrate of claim 1, wherein the low-resistance electrode pattern entirely overlaps with the gate metal pattern and the data metal pattern.

* * * * *